United States Patent
Bowes

(10) Patent No.: US 6,990,743 B2
(45) Date of Patent: Jan. 31, 2006

(54) PROCESS FOR MONITORING MEASURING DEVICE PERFORMANCE

(75) Inventor: Steve W. Bowes, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,595

(22) Filed: Aug. 29, 2002

(65) Prior Publication Data

US 2004/0040165 A1    Mar. 4, 2004

(51) Int. Cl.
G01D 18/00 (2006.01)
H01J 37/26 (2006.01)

(52) U.S. Cl. .............. 33/502; 250/252.1; 250/311; 702/95

(58) Field of Classification Search ............ 33/549, 33/551, 545, 546, 547, 1 V, 1 BB, 502; 73/1.79, 73/1.81; 702/85, 94, 95, 97, 104, 105, 150, 702/151, 152, 153, 155, 156, 157, 158, 159, 702/163, 164, 167, 168; 250/252.1, 307, 250/310, 311

See application file for complete search history.

(56) References Cited

U.S. PATENT DOCUMENTS

| | | | | |
|---|---|---|---|---|
| 3,626,384 A * | 12/1971 | Davis | ............ | 702/195 |
| 4,583,298 A * | 4/1986 | Raugh | ............ | 33/502 |
| 4,587,622 A * | 5/1986 | Herzog | ............ | 702/97 |
| 4,771,237 A * | 9/1988 | Daley | ............ | 324/202 |
| 4,907,287 A * | 3/1990 | Homma et al. | ............ | 382/255 |
| 5,134,781 A * | 8/1992 | Baker | ............ | 33/502 |
| RE34,070 E * | 9/1992 | Regimand | ............ | 73/1.88 |
| 5,187,874 A * | 2/1993 | Takahashi et al. | ............ | 33/502 |
| 5,218,195 A * | 6/1993 | Hakamata | ............ | 250/216 |
| 5,426,861 A * | 6/1995 | Shelton | ............ | 33/502 |
| 5,561,611 A * | 10/1996 | Avinash | ............ | 702/111 |
| 5,610,846 A * | 3/1997 | Trapet et al. | ............ | 702/95 |
| 5,644,512 A * | 7/1997 | Chernoff et al. | ............ | 702/85 |
| 5,671,541 A * | 9/1997 | Dai et al. | ............ | 33/502 |
| 5,969,273 A * | 10/1999 | Archie et al. | ............ | 73/865.8 |
| 6,092,411 A * | 7/2000 | Tokoi | ............ | 73/1.79 |
| 6,111,981 A * | 8/2000 | Tsubusaki et al. | ............ | 382/172 |
| 6,326,618 B1 * | 12/2001 | Kane et al. | ............ | 250/307 |
| 6,384,408 B1 * | 5/2002 | Yee et al. | ............ | 250/252.1 |
| 6,396,059 B1 * | 5/2002 | Singh et al. | ............ | 250/310 |
| 6,405,153 B1 * | 6/2002 | Fiekowsky | ............ | 702/172 |
| 6,465,141 B2 | 10/2002 | Boettiger et al. | ............ | 430/30 |
| 6,480,807 B1 * | 11/2002 | Miyano | ............ | 702/159 |
| 6,521,891 B1 * | 2/2003 | Dotan et al. | ............ | 250/310 |
| 6,532,428 B1 * | 3/2003 | Toprac | ............ | 702/97 |
| 6,538,249 B1 * | 3/2003 | Takane et al. | ............ | 250/310 |
| 6,545,275 B1 * | 4/2003 | Pearl et al. | ............ | 250/310 |
| 6,546,640 B2 * | 4/2003 | Okada et al. | ............ | 33/503 |
| 6,570,157 B1 * | 5/2003 | Singh et al. | ............ | 250/311 |
| 6,573,497 B1 * | 6/2003 | Rangarajan et al. | ............ | 250/306 |
| 6,573,498 B1 * | 6/2003 | Rangarajan et al. | ............ | 250/307 |
| 6,594,532 B2 * | 7/2003 | Mills | ............ | 700/56 |
| 6,597,447 B1 * | 7/2003 | Stirton et al. | ............ | 356/237.2 |
| 6,601,434 B2 * | 8/2003 | Schaefer | ............ | 73/1.79 |
| 6,661,007 B1 * | 12/2003 | Sicignano et al. | ............ | 250/307 |
| 6,721,691 B2 * | 4/2004 | Bao et al. | ............ | 702/189 |
| 6,768,958 B2 * | 7/2004 | Ivanovic et al. | ............ | 702/94 |

(Continued)

Primary Examiner—R. Alexander Smith
(74) Attorney, Agent, or Firm—Fletcher Yoder

(57) ABSTRACT

The disclosed embodiments relate to calibrating a measuring device by comparing a set of master measurement data against a set of current measurement data. Adjustments are made to the measuring device based on the difference between the current measurement data and the master measurement data.

43 Claims, 6 Drawing Sheets

U.S. PATENT DOCUMENTS

| | | | |
|---|---|---|---|
| 6,795,193 B2 * | 9/2004 | Schulz | 356/445 |
| 6,882,958 B2 * | 4/2005 | Schmidt et al. | 702/179 |
| 6,898,537 B1 * | 5/2005 | McGahan | 702/76 |
| 2001/0002697 A1 * | 6/2001 | Hiroi et al. | 250/310 |
| 2003/0101013 A1 * | 5/2003 | Solecky et al. | 702/85 |
| 2004/0262519 A1 * | 12/2004 | Nam-Koong | 250/311 |

* cited by examiner

400

PROCESS FOR MONITORING MEASURING DEVICE PERFORMANCE

BACKGROUND OF THE INVENTION

1. Field of the Invention

The present invention relates generally to calibrating test equipment and, more particularly, to a method of maintaining calibration of scanning electron microscopes (SEMs) such that repeatable performance may be obtained.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The scanning electron microscope (SEM) is used to create magnified images. As with all microscopes, the main purpose is magnification with clarity. Conventional light microscopes use multiple glass lenses to bend light waves to create a magnified image. The SEM is able to achieve much higher magnification than the light microscope largely because the SEM uses electrons instead of light waves to create the image. The SEM emits a beam of high energy electrons through a column in which a vacuum has been established. This beam travels downward and is focused into a very fine point by a series of magnetic lenses. The focused beam moves back and forth across the specimen, scanning it row by row. As the electron beam contacts the specimen at each spot, secondary electrons are displaced from its surface and electrons are scattered. These electrons are then counted by a detector, which sends signals to an amplifier. The number of electrons emitted from each spot on the sample is determined, and the data is combined to create the final image. The amount of scattering of electrons in any direction is a function of the angle made by the beam with the surface of the specimen and as a result, the image produced has a three dimensional appearance.

One use of SEMs is in the manufacture of semiconductor devices. SEMs are typically used in semiconductor manufacturing to measure the dimensions of articles of manufacture to ensure that certain specifications are met. This primarily involves measuring what is known as the critical dimension (CD) of an object such as an integrated circuit die or feature thereof. The CD is generally the length or width of a line, space, or contact. When the CD of a particular article is outside of a defined range, that article may not meet required specifications. If, for example, a wafer has been over exposed, an electrical contact may become enlarged such that it is beyond the specification for that part. This error can be made evident by utilizing an SEM to measure the CD. When a product is found to be defective for having a measurement that is out of specification, the product may be scrapped or subjected to corrective measures.

An SEM must be manually adjusted on a regular basis to keep it at optimum performance. These manual adjustments involve adjustment of resolution, magnification, and lens aberration. Because these adjustments are subjective, variations can be introduced resulting in distortion and incorrect measurement. For example, magnification in one part of the image may be different from another part of the image. The undesirable variation in image magnification may result in errors in categorizing devices measured with the SEM. In other words, devices measured with the SEM may be incorrectly categorized as out of specification. More problematic is the possibility that devices that in fact do not meet a given specification could be categorized as meeting the specification. Erroneous categorization of devices that are actually out of specification could result in subsequent problems such as failure of a device in the field or other performance problems.

A known method of calibration involves measuring a line and using the measurements to judge subsequent SEM setups as either acceptable or unacceptable. After the initial measurements of the line are obtained, the same line may be re-measured at periodic intervals (for example, daily or weekly). If measurements taken at later times are within a predetermined tolerance of the original measurements, the setup of the device may be deemed to be acceptable. If subsequent measurements are outside of a predetermined range, the machine may be subject to corrective action, such as modifying certain settings.

One problem with using lines as setup guides is that carbon deposits may accumulate on the line to be measured and actually change the length of the line. Thus, subsequent measurements of the line may not accurately reflect the true calibration of the SEM. SEMs are typically used to measure very small structures, so even small buildups may be problematic.

Another known practice for calibration involves what is known as a pitch test. In a pitch test, the pitch between a space and a line are measured. The pitch (or orientation) of the space relative to the line has been found not to change significantly even if deposits are present. Accordingly, the pitch test somewhat overcomes the problem of carbon deposits. However, the pitch test method does not take into account that astigmatism may have been introduced into the setup of the SEM. Corrections to account for astigmatism may be performed through a process known as "wobbling." In wobbling, an operator may wobble the lens of the SEM to attempt to stabilize the image. Wobbling, however, is prone to subjective error.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
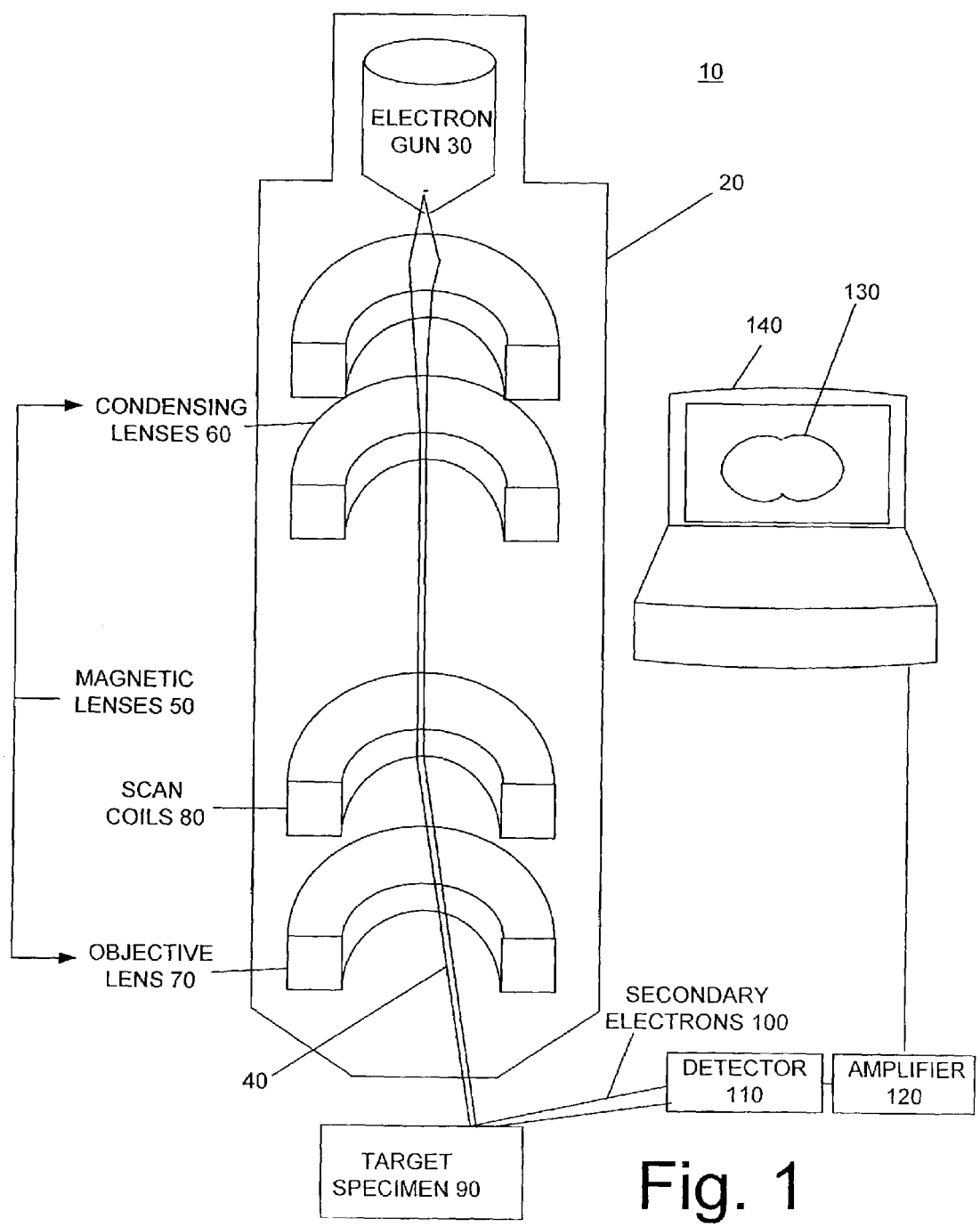
FIG. 1 is a block diagram of a scanning electron microscope (SEM)

Turning now to the drawings, FIG. 1 is a block diagram of a scanning electron microscope (SEM) 10. The SEM 10 comprises a vacuum column 20, which contains elements of the SEM 10 and allows air to be pumped out to create a vacuum. Typically, when an SEM 10 is in use, air is pumped out of the vacuum column 20, and an electron gun 30 situated at one end of the vacuum column 20 emits a beam of high energy electrons 40. The high energy electron beam 40 travels axially through the vacuum column 20, which contains a series of magnetic lenses 50 comprising condensing lenses 60 and an objective lens 70. These magnetic lenses 50 are designed to focus the electron beam 40 to a very fine spot.

Near the end of the vacuum column 20 opposite the electron gun 30, a set of scanning coils 80 function to move the focused electron beam 40 in a scanning motion, row by row, across a target specimen 90. Secondary electrons 100 are displaced from the surface of the target specimen 90 as the electron beam 40 hits each spot on the surface. A detector 110 counts the secondary electrons 100 and sends signals to an amplifier 120. Data from the amplifier 120 is converted into an image 130. The numbers of electrons emitted from each spot on the target specimen are used to build the final image 130, which may be displayed on a monitor 140.

Figure 2:
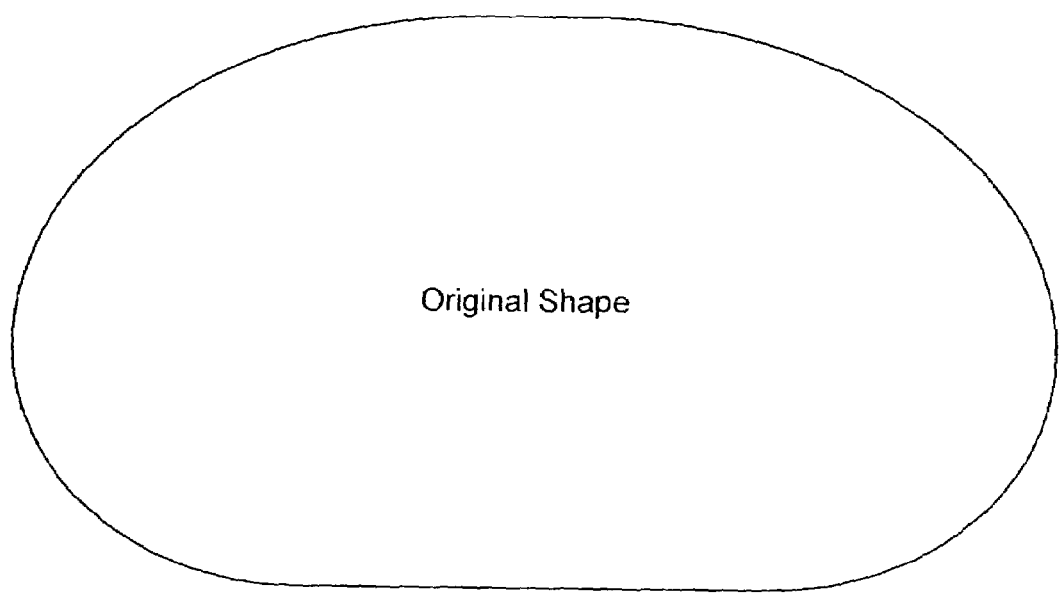
FIG. 2 is an example of an original shape that may be used for standardization and calibration of a scanning electron microscope in accordance with the present invention.

In one example of the method disclosed herein, an original shape 200 is used as the target specimen 90 and is standardized to assist in calibration of the SEM 10. FIG. 2 depicts an original shape 200 as viewed through the SEM 10. The method disclosed herein may use a shape such as the one illustrated in FIG. 2 to assist with calibration of a device such as an SEM. As can be appreciated by those skilled in the art, a variety of shapes may be used.

The original test shape 200 may be made from material such as silicon or any other material. The material used to construct the original shape 200 is not believed to be a crucial aspect of the present invention. The original shape 200 may be measured repeatedly over a period of time to obtain data that may be used to create a mathematical model using techniques such as polynomial curve fitting or Fourier analysis. The data thus created may comprise master measurement data that may be used for subsequent comparison to ensure correct calibration of the SEM 10.

Closed shapes, such as the shape illustrated in FIG. 2, have been found to facilitate the creation of mathematical models that allow effective calibration of the SEM 10. This is true at least because mathematical modeling of closed shapes may produce data that corresponds to a wide variety of characteristics about the shape being modeled. That data may be used to correct specific features of the SEM setup that relate to the relevant characteristics without disturbing setup parameters that are unrelated. For example, a polynomial equation may be used to model the test shape mathematically when measurements are taken. Each coefficient of a polynomial equation may embody given information about a different characteristic of the measured object. Examples of the characteristics that may be embodied in a mathematical model include linearity, rotation, orientation, and the like. When a subsequent calibration measurement of a test shape is taken, the resulting mathematical model may indicate a variation in the parameters affecting the coefficient that represents rotation of the image. The elements of the SEM setup that affect the rotation of the image may then be adjusted to obtain better calibration.

Figure 3:
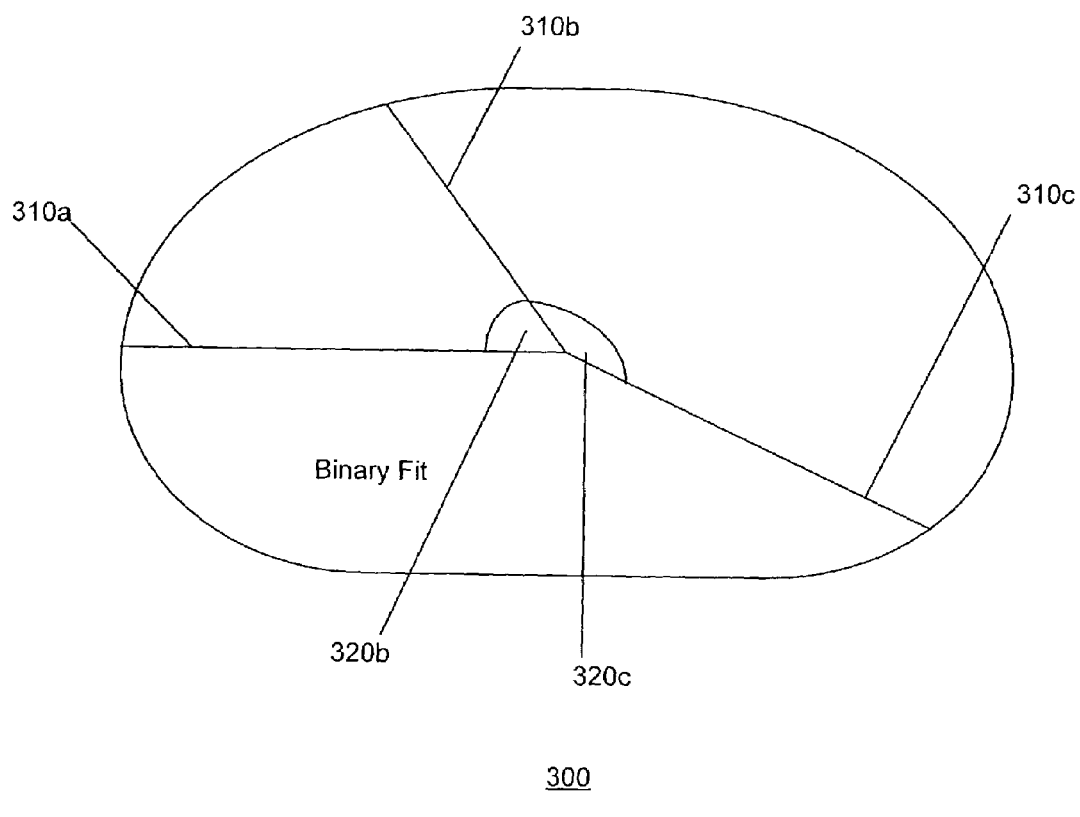
FIG. 3 is an example of a binary fit of the shape illustrated in FIG. 2.

As previously noted, a mathematical model of the original shape 200 is derived. FIG. 3 depicts a binary fit 300 of the original shape 200, which is essentially an outline of the original shape 200. In one example of this process, the binary fit 300 may be used to assist with mathematically modeling the original shape 200. Measurements of radii 310a, 310b and 310c of the original shape 200 and measurements of corresponding angles 320b and 320c may be obtained from the binary fit 300. The radii 310a, 310b and 310c and angles 320b and 320c illustrated in FIG. 3 are merely representative. Those of ordinary skill in the art will appreciate that there are actually many different radii and angles that are not specifically illustrated.

Figure 4:
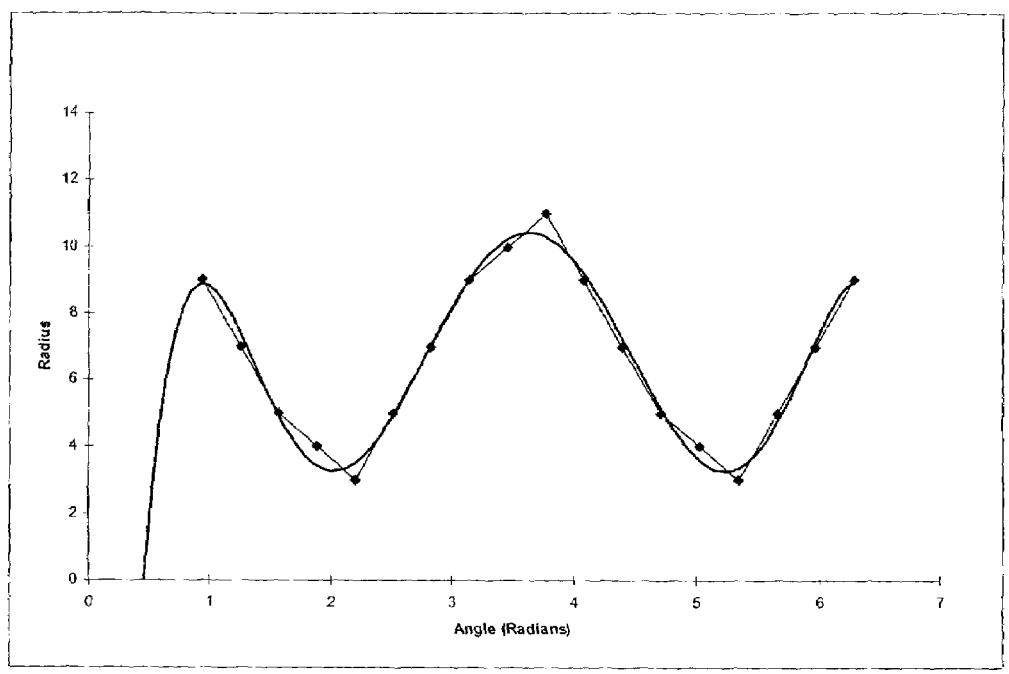
FIG. 4 is an example of a polynomial fit of the radii of the shape illustrated in FIG. 2 graphed on the Y-axis with the corresponding angles in radians on the X-axis.

Additionally, depending on the shape being used, the various radii and angles may vary not only between shapes but also may vary at different points within a particular shape. These measurements may be used in one example of the method disclosed herein to establish a mathematical model of the original shape 200. For example, FIG. 4 depicts a polynomial fit 400 derived by graphing the varying radii of the original shape 200 on a Y-axis with the corresponding angles in radians on an X-axis. The particular polynomial fit 400 as shown is an eighth order polynomial which may be represented by the equation $P(x) = a_n x^n + \ldots + a_2 x^2 + a_1 x^1 + a_0$, where n=8. The variable n represents the order of the polynomial. The higher the order of polynomial, the closer it will be to an exact mathematical description of the original shape and the more information will be obtainable from coefficients to assist with calibration. Also, higher order polynomial models yield more coefficients, each corresponding to a particular characteristic of the original shape 200. Higher order polynomial models thus produce more data and may result in more accurate calibration of the SEM 10.

As set forth above, a wide variety of mathematical modeling techniques may be used to create master measurement data. The order of polynomial used to model the original shape 200 and even the use of a polynomial type expression for representing the original shape are not believed to be crucial aspects of the invention. As can be appreciated by those skilled in the art, many mathematical equations adequately modeling the original shape 200 may be used.

The master measurement data obtained during an initial calibration may be used as a standard against which to judge subsequent calibration measurements. A mathematical model of the image as being viewed at the time of calibration is derived and compared to the mathematical model of the established standard. Differences in the two equations may indicate that certain corrections should be made to ensure the SEM 10 is properly calibrated within certain specifications. When variations between the master measurement data and data taken in a subsequent reading are found, the variations in the mathematical model data may indicate the specific areas of the SEM 10 that require adjustment.

For example, if a Fourier Series represented by the equation $r(\theta)=a_0+a_1 \sin \theta+b_1 \cos \theta+a_2 \sin 2\theta+b_2 \cos 2\theta+ \ldots +a_n \sin n\theta+b_n \sin n\theta$ is used to mathematically model the original shape 200, and the zero term, $a_0$, has changed between the standard mathematical model and the mathematical model derived at the time of calibration, this may indicate that the image has changed size. This could indicate a problem with the SEM settings that relate to magnification. Similarly, if the $\sin \theta$ term changed, a change in symmetry may be indicated. This may indicate a problem with SEM settings that relate to orientation or rotation of the image. By knowing what terms have changed between the mathematical model of the image being taken and the mathematical model of the standard, one skilled in the art can relate those changes to what physical settings should be changed on the SEM 10 to properly calibrate the device.

Figure 5:
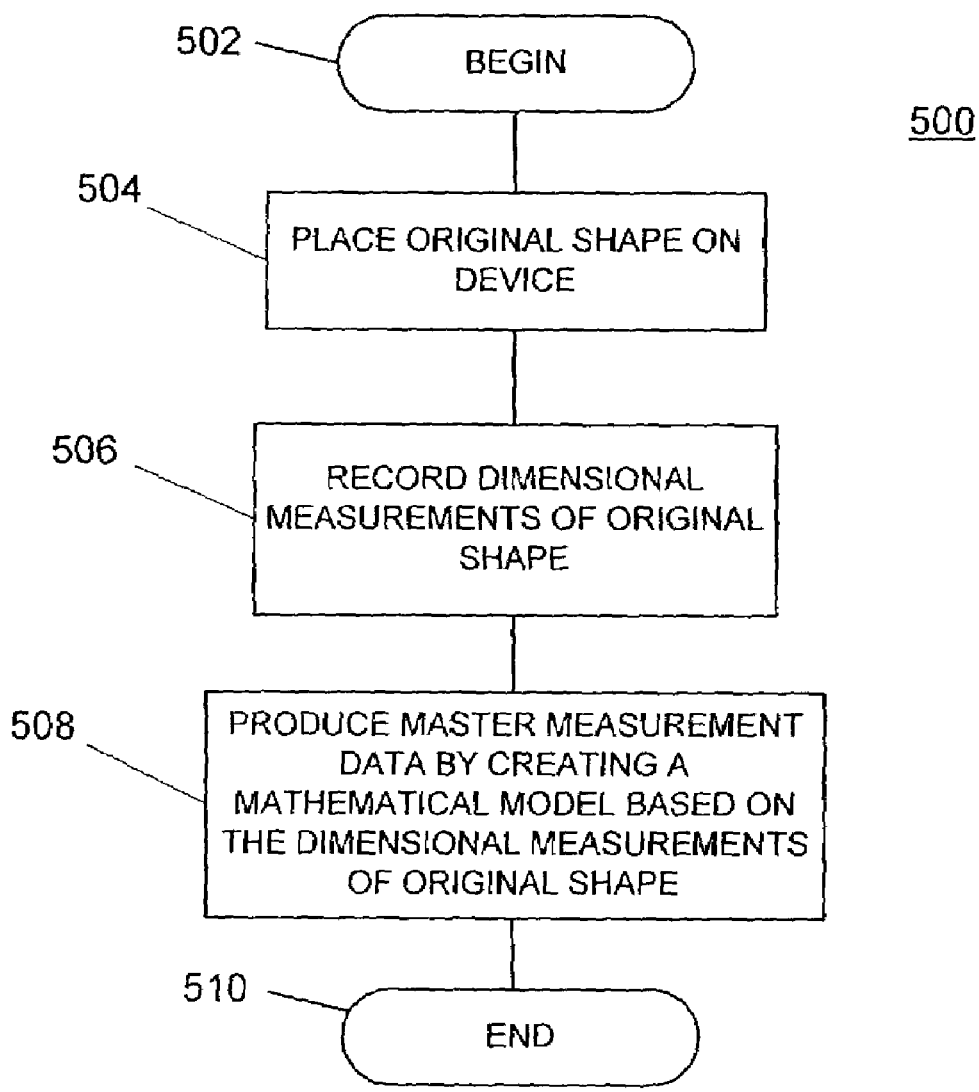
FIG. 5 is a process flow diagram showing an example of a process for using an original shape to create a set of master measurement data that may be used for calibration of a measurement device.

FIG. 5 is a process flow diagram showing an example of a process for using an original shape to create a set of master measurement data that may be used for calibration of a measurement device. The technique is generally referred to by the reference numeral 500. At block 502, the technique begins. The beginning of the process may correspond to the powering up or initialization of a device such as the SEM 10.

At block 504, an original shape 200 is placed on a device, such as the SEM 10, for viewing. In one example of this technique, an original shape 200 is made from a material such as silicon. As shown at block 506, the dimensional measurements of the original shape 200 are recorded. Using the dimensional measurements, a mathematical model of the original shape 200 is derived, as indicated at block 508. The mathematical model is used to produce a set of master measurement data. As set forth above, the master measurement data may be comprised of measurement data taken over an extended period of time. At block 510, the process of creating the master measurement data ends. The master measurement data may be used as a standard by which to judge subsequent measurement data. The difference between the subsequent measurement data and the master measurement data may be used to calibrate the setup of the SEM 10.

Figure 6:
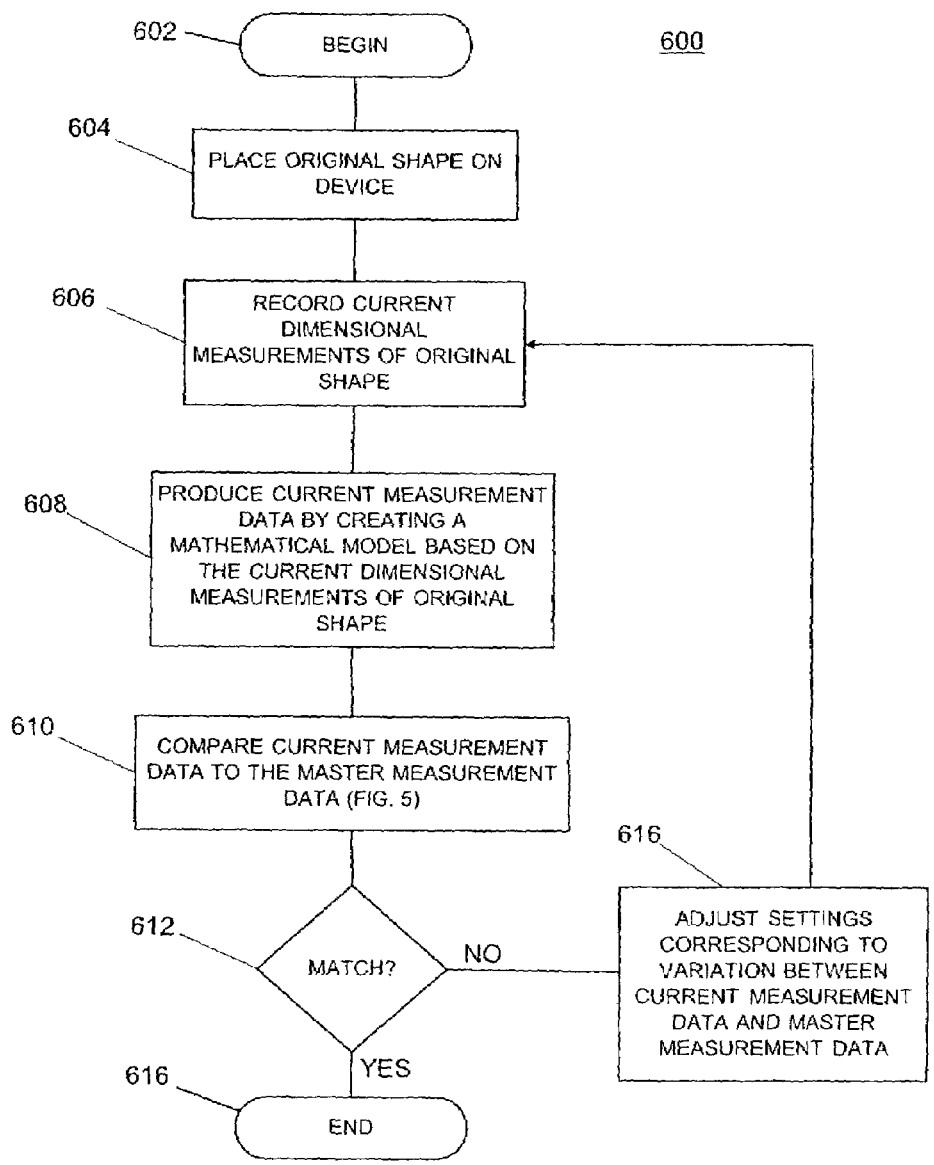
FIG. 6 is a process flow diagram showing an example of a process for creating current measurement data and comparing the current measurement data to the master measurement data obtained from the process shown in FIG. 5.

FIG. 6 is a process flow diagram showing an example of a process for creating current measurement data and comparing the current measurement data to the master measurement data obtained from the process shown in FIG. 5. The process is generally referred to by the reference numeral 600. At block 602, the process begins. The beginning of the process may correspond to the powering up or initialization of a device such as the SEM 10. At block 604, the original shape 200 previously used to create the master measurement data is placed on a device for viewing.

As shown at block 606, the current dimensional measurements of the original shape 200 are recorded. Using the current dimensional measurements, a mathematical model of the original shape 200 is derived and current measurement data is produced, as illustrated at block 608. At block 610, the current dimensional data is compared to the master measurement data created, for example, using the process illustrated in FIG. 5. At block 612, a determination is made about whether the current dimensional data is close enough to the master measurement data to declare the calibration of the SEM 10 to be acceptable. One method of making this determination is to evaluate whether the current measurement data is within a predetermined range of the master measurement data.

If the current measurement data is not sufficiently close to the master measurement data, certain aspects of calibration corresponding to differences in the mathematical models are adjusted, as shown at block 616. Operation then continues at block 606. If, however, the current measurement data is sufficiently close to the master measurement data at block 612, the calibration of the SEM 10 is complete and the process ends, as shown at block 618.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of calibrating a measuring device, the method comprising the acts of:

determining reference dimensional measurements of a shape based on a calibrated image of the shape;

creating a reference mathematical representation of the shape based on the reference dimensional measurements, the reference mathematical representation comprising a plurality of reference equation terms, each of the plurality of reference equation terms relating to one of a plurality of image characteristics;

determining current dimensional measurements of the shape based on a current image of the shape;

creating a current mathematical representation of the shape based on the current dimensional measurements, the current mathematical representation comprising a plurality of current equation terms, each of the plurality of current equation terms relating to one of the plurality of image characteristics;

comparing the plurality of current equation terms to the plurality of reference equation terms; and adjusting settings of the measuring device for certain image characteristics based on a difference between a one of the plurality of current equation terms and a one of the plurality of reference equation terms.

2. The method of claim 1, wherein the shape comprises a closed shape.

3. The method of claim 1, comprising creating a polynomial representation of the shape.

4. The method of claim 1, wherein at least one of the plurality of reference equation terms corresponds to a rotation of the image.

5. The method of claim 1, wherein at least one of the plurality of reference equation terms corresponds to a magnification value of the image.

6. The method of claim 1, comprising performing Fourier analysis on the reference dimensional measurements.

7. The method of claim 1, wherein the measuring device comprises a scanning electron microscope (SEM).

8. The method of claim 1, comprising adjusting a magnification setting of the measurement device based on a discrepancy between a one of the plurality of reference equation terms and a corresponding one of the plurality of current equation terms.

9. A method of calibrating a measuring device, the method comprising:

determining a set of reference measurement data from a calibrated image of a reference shape;

creating a mathematical representation of the reference shape based on the reference measurement data;

determining a set of reference equation terms from the mathematical representation, each of the reference equation terms relating to a visual characteristic of the calibrated image;

determining a set of current measurement data from a current image of the reference shape;

creating a current mathematical representation of the master shape based on the current measurement data, the current mathematical representation having a set of current equation terms;

comparing the set of current equation terms to the set of reference equation terms; and adjusting a setting of the measuring device based on a difference between a one of the set of current equation terms and a one of the set of master equation terms.

10. The method of claim 9, wherein the reference shape comprises a closed shape.

11. The method of claim 9, comprising creating a polynomial representation of the reference shape.

12. The method of claim 9, comprising representing the reference shape with a Fourier Series having a zero term.

13. The method of claim 12, wherein the zero term of the Fourier Series corresponds to a size characteristic of the master shape.

14. The method of claim 9, comprising determining whether calibration is complete by determining whether the current measurement data is within a predetermined range of the reference measurement data.

15. The method of claim 9, wherein the measuring device comprises a scanning electron microscope (SEM).

16. The method of claim 15, wherein the reference shape is placed on a scanning area of the SEM.

17. A method of calibrating an electron microscope, the method comprising:

measuring a master shape and creating an image of the master shape with the electron microscope;

determining dimensional measurements of the master shape;

creating a mathematical representation of the master shape based on the dimensional measurements, the mathematical representation of the master shape comprising a plurality of master terms, each of the plurality of master terms corresponding to a one of a plurality of image characteristics;

obtaining a set of current measurement data from the master shape;

creating a current mathematical representation of the master shape based on the current measurement data, the current mathematical representation having a plurality of current terms corresponding to the plurality of master terms;

comparing a one of the plurality of current terms with a one of the plurality of master terms; and adjusting a setting of the electron microscope relating to a particular image characteristic based on a difference between the one of the plurality of current terms and the one of the plurality of master terms and the related one of the plurality of image characteristics.

18. The method of claim 17, wherein the master shape comprises a closed shape.

19. The method of claim 17, comprising creating a polynomial representation of the master shape.

20. The method of claim 19, wherein the polynomial representation comprises a plurality of coefficients.

21. The method of claim 17, comprising adjusting a magnification setting on the electron microscope based on the difference between the one of the plurality of current terms and the one of the plurality of master terms.

22. The method of claim 17, comprising performing Fourier analysis on the dimensional measurements.

23. The method of claim 17, wherein the electron microscope comprises a scanning electron microscope (SEM).

24. The method of claim 23, wherein the shape is placed on a scanning area of the SEM.

25. A method of calibrating a measuring device, comprising:

determining dimensional measurements of a master shape;

creating a mathematical representation of the master shape based on the dimensional measurements, the mathematical representation having master equation terms;

defining a correspondence between the master equation terms and image characteristics of the master shape;

determining dimensional measurements of the master shape at a later time;

creating a second mathematical representation of the master shape based on the dimensional measurements at the later time, the second mathematical representation having equation terms;

comparing the equation terms obtained at the later time to the master equation terms; and adjusting settings of the measurement device relating to image characteristics correlative to a difference between the equation terms obtained at the later time and the master equation terms.

26. The method of claim 25, wherein one or more of the recited acts are repeated to produce the master terms.

27. The method of claim 25, wherein the master shape comprises a closed shape.

28. The method of claim 25, comprising creating a polynomial representation of the master shape.

29. The method of claim 28, wherein the polynomial representation comprises a plurality of coefficients.

30. The method of claim 25, comprising adjusting a magnification setting on the measuring device based on the difference between the equation terms obtained at the later time and the master equation terms.

31. The method of claim 25, comprising performing Fourier analysis on the dimensional measurements.

32. The method of claim 25, wherein the measuring device comprises a scanning electron microscope (SEM).

33. The method of claim 32, wherein the shape is placed on a scanning area of the SEM.

34. A method of producing an integrated circuit device, comprising:

measuring a reference shape with a measuring device to determine measurements thereof;

creating a reference mathematical representation of the reference shape based on the measurements of the reference shape, the reference mathematical representation having a plurality of reference equation terms, each of the plurality of reference equation terms corresponding to an image characteristic of the reference shape;

calibrating the measuring device by creating a current mathematical representation of the reference shape, the current mathematical representation having current equation terms, and adjusting the measuring device based on a difference between the current equation terms and the reference equation terms and corresponding image characteristics; and using the measurement device to measure at least one dimension of the integrated circuit device.

35. The method of claim 34, comprising creating a polynomial representation to mathematically represent the reference shape.

36. The method of claim 35, wherein the polynomial representation comprises a plurality of coefficients.

37. The method of claim 36, wherein the reference mathematical representation is a Fourier Series.

38. The method of claim 34, comprising adjusting a magnification setting of the measuring device based on a difference between a one of the current equation terms and a one of the reference equation terms.

39. The method of claim 34, wherein the measuring device is a scanning electron microscope (SEM).

40. The method of claim 39, comprising placing the reference shape on a scanning area of the SEM.

41. A method of calibrating a scanning electron microscope (SEM) the method comprising the acts of:

creating a first mathematical representation of a shape based on a first image of the shape produced by the SEM, the first mathematical representation comprising a first plurality of equation terms, each of the first plurality of equation terms relating to one of a plurality of image characteristics;

creating a second mathematical representation of the shape based on a second image of the shape produced by the SEM, the second mathematical representation comprising a second plurality of equation terms, each of the second plurality of equation terms relating to one of the plurality of image characteristics;

comparing the first mathematical representation and the second mathematical representation to determine differences in the first plurality of equation terms and the second plurality of equation terms; and adjusting a setting of the SEM relating to a particular image characteristic based on a difference between a one of the first plurality of equation terms and a one of the second plurality of equation terms.

42. The method of claim 41, comprising adjusting a magnification setting based on a difference between a first equation term of the first mathematical representation and a second equation term of the second mathematical representation.

43. The method of claim 41, wherein the first mathematical representation and the second mathematical representation are polynomial representations of the shape.

* * * * *